United States Patent [19]
Ueda et al.

[11] Patent Number: 5,125,358
[45] Date of Patent: Jun. 30, 1992

[54] MICROWAVE PLASMA FILM DEPOSITION SYSTEM

[75] Inventors: Tetsuya Ueda; Naoki Suzuki; Kohsaku Yano, all of Osaka, Japan

[73] Assignee: Matsushita Electric Industrial Co., Ltd., Japan

[21] Appl. No.: 384,699

[22] Filed: Jul. 25, 1989

[30] Foreign Application Priority Data

Jul. 26, 1988 [JP] Japan ................. 63-185964
Sep. 29, 1988 [JP] Japan ................. 63-244906

[51] Int. Cl.$^5$ ............................................ C23C 16/50
[52] U.S. Cl. .................................. 118/723; 427/39; 427/45.1
[58] Field of Search ............... 118/723; 156/345, 653, 156/656; 315/111.21, 111.41, 111.71; 427/45.1, 39

[56] References Cited

U.S. PATENT DOCUMENTS

| 4,401,054 | 8/1983 | Matsuo et al. | 427/45.1 |
| 4,610,770 | 9/1986 | Saito et al. | 204/192.1 |
| 4,883,686 | 11/1989 | Doehler et al. | 427/38 |
| 4,913,928 | 4/1990 | Sugita et al. | 118/723 |

FOREIGN PATENT DOCUMENTS

| 59-47728 | 3/1984 | Japan | . |
| 59-219461 | 12/1984 | Japan | 118/723 |
| 61-135126 | 6/1986 | Japan | 118/723 |
| 62-7859 | 1/1987 | Japan | 427/45.1 |
| 62-254419 | 11/1987 | Japan | 118/723 |
| 63-33575 | 2/1988 | Japan | 118/723 |
| 63-227777 | 9/1988 | Japan | 118/723 |
| 63-278221 | 11/1988 | Japan | 118/723 |

Primary Examiner—Shrive Beck
Assistant Examiner—Terry J. Owens
Attorney, Agent, or Firm—Lowe, Price, LeBlanc & Becker

[57] ABSTRACT

A microwave plasma film deposition system comprises a waveguide for feeding microwaves through a microwave feeding window provided at one end of the waveguide, and a plasma cavity in communication with the other end of the waveguide and having a discharge gas inlet which is not in communication with the waveguide. The system further includes a specimen chamber which is in communication with the plasma cavity and which has a substrate setting rest therein and a material gas inlet, and a magnetic field applying device provided near the plasma cavity. Stable film deposition occurs because the plasma cavity is at the end of the waveguide which is remote from the microwave feeding window, whereby deposition on the microwave feeding window is prevented. Deposition on the microwave feeding window is further prevented by a ferromagnetic material which is placed around the waveguide and which reduces the strength of the magnetic field in the waveguide.

2 Claims, 11 Drawing Sheets

MICROWAVE PLASMA FILM DEPOSITION SYSTEM

BACKGROUND OF THE INVENTION

1. Field of the Invention

This invention generally relates to a thin film deposition apparatus and more particularly to the improvement of a microwave plasma film deposition system for depostion of a thin film by using electron cyclotron resonance (hereunder abbreviated as ECR) plasma.

2. Description of the Related Art

As an example of a conventional metal thin film deposition apparatus using microvwave, Japanese Patent Application Provisional Publication No. 59-47728 discloses a plasma thin film deposition apparatus including a plasma cavity, in which plasma is generated, and a specimen chamber for accommodating a specimen and further including a plasma extraction window having a target provided therebetween, whereby gas can be supplied to both the plasma cavity and the specimen chamber. This conventional apparatus can effect low-temperature thin film deposition, which is an advantage of ECR plasma thin film deposition method. and can deposit a thin film of good quality with the extent of the strength of depositing thereof being large.

Figure 1:
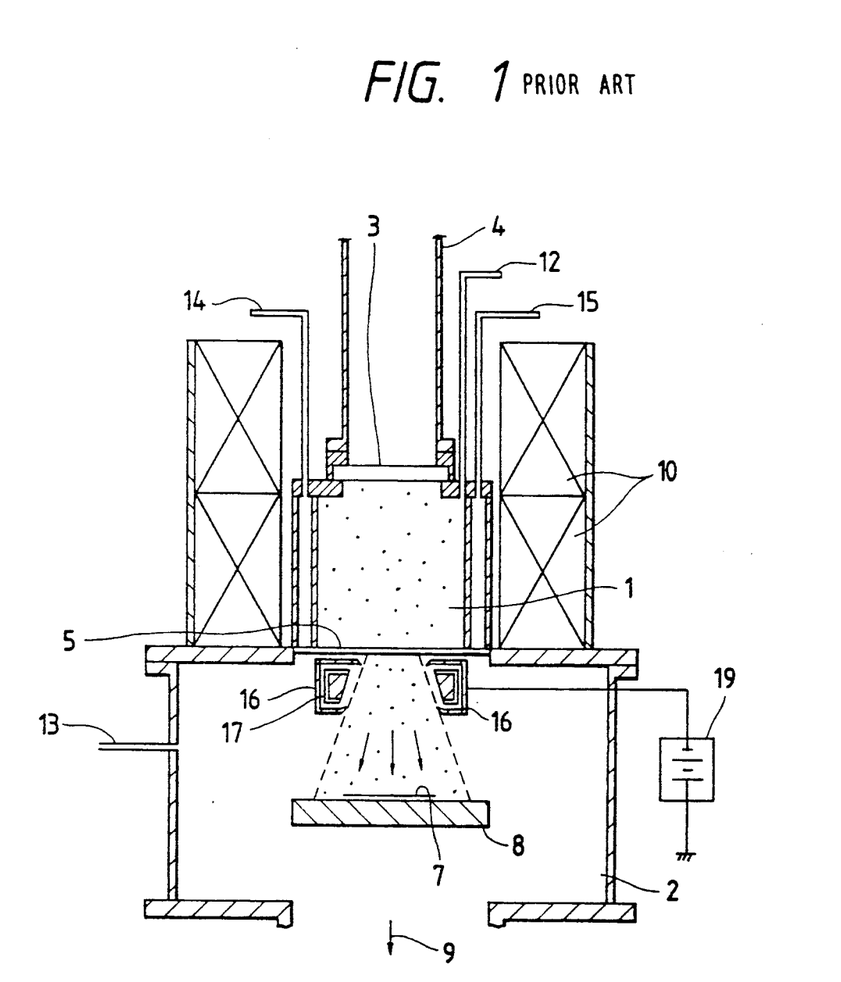
FIG. 1 is a schematic vertical sectional view of a conventional ECR metal thin film deposition apparatus.

FIG. 1 is a diagram for showing the construction of the above described plasma thin film depostion apparatus. In this figure, reference numeral 1 designates a plasma cavity; 2 a specimen chamber; and 3 a microwave feeding window using a quartz glass. Microwave is supplied from a rectangular waveguide 4 through the microwave feeding window 3 to the plasma cavity 1. Further, in the plasma cavity 1, a plasma extraction window 5 is provided in such a manner to face the microwave feeding window 3, and the plasma is introduced onto a specimen rest on which a specimen substrate 7 is arranged . The specimen chamber 2 is connected to an evacuation system 9. A magnetic coil 10 is provided around the periphery of the plasma cavity 1 and the magnitude of the magnetic field produced by the magnetic coil 10 is arranged such that the conditions required for occurring ECR in case of microwave are satisified in a part of the plasma cavity 1. Further, this conventional apparatus is provided with two gas supplying systems, that is, a first gas supplying system 12 for supplying gas used for generating plasma to the plasma cavity 1 and a second gas supplying system 13 for supplying feed gas to the specimen chamber 2. Moreover, the plasma cavity 1 is refrigerated by letting refrigerant run through pipes 13 thru 15. Furthermore, a target electrode 17 containing sputtering material 16 is arranged in such a manner to surround a plasma flow and is connected to a power source 19 for sputtering.

Indeed, this metal thin film deposition apparatus making use of the ECR plasma and the sputtering technique takes the advantage of the ECR plasma. However, in the case where the thin film is conductive, particles of metallic atoms sputtered from a sputtering target are diffused in the plasma cavity 1 and then the deposition of the metal thin film on the surface of the microwave feeding window 3 occurs and prevents the propagation of the microwave so that it becomes impossible to stably discharge and thus the deposition of the thin film cannot be continued. Thus, this conventional apparatus has a drawback that the deposition of the thin film cannot be effected with good reproductiveness.

Incidentally, by this apparatus, the deposition of the thin film can be effected by using chemical vapor deposition (hereunder abbreviated as CVD) method. Moreover, in theory, the deposition of a metal thin film can be effected by this apparatus on condition that a discharge gas (for example, hydrogen gas) is issued from the first gas supplying system 12 and on the other hand an organometallic gas (for instance, tri-methyl aluminum (TMA) gas and $WF_6$ gas) is issued from the second gas supplying system 13. However, the deposition of the metal thin film cannot be stably effected by this conventional apparatus for the same reason as above described with relation to the case of the deposition of the conductive thin film.

This invention is accomplished to eliminate the drawbacks of the conventional apparatus above described.

SUMMARY OF THE INVENTION

It is therefore an object of the present invention to provide a microwave plasma thin film deposition apparatus which can prevent the plasma discharge from occurring in the vicinity of the microwave feeding window to insure stable discharge and, in case of the deposition of a thin film using the ECR plasma, perform the deposition of a thin film with good reproductiveness even if the thin film is conductive. As above described, the conventional apparatus has encountered a problem in the introduction of a microwave to a plasma cavity. It is accordingly another object of the present invention to improve a micorwave feeding window and a waveguide for feeding the microwave into a plasma cavity.

To achieve the foregoing objects and in accordance with a first aspect of the present invention, there is provided a microwave plasma thin film depositon apparatus which comprises a waveguide for feeding microwave through a microwave feeding window provided at an end thereof, a plasma cavity providing communication from another end of the waveguide thereto and having discharging gas inlet, a specimen chamber providing communication from the plasma cavity thereto and having a specimen gas inlet, a magnetic field applying means placed in the vicinity of the palsma cavity and a substrate setting rest placed in the specimen chamber.

Thereby, the microwave feeding window can be separated from an ECR plasma source.

Further, in accordance with a second aspect of the present invention, there is provided a microwave plasma thin film deposition apparatus which comprises a waveguide for feeding microwave through a microwave feeding window provided at an end thereof, a plasma cavity providing communication from another end of tghe waveguide thereto and having a discharging gas inlet, a specimen chamber providing communication from the plasma cavity thereto and having a specimen gas inlet, a magnetic field applying means placed in the vicinity of the plasma cavity and a substrate setting rest placed in the specimen chamber, wherein the length of the waveguide in the direction of propagating the microwave is longer than the mean free path of the atoms of the gas.

Thereby, precursor or active species to be deposited cannot reach the microwave feeding window.

Furthermore, in accordance wiht a third aspect of the present invention, there is provided a microwave plasma thin film depostion apparatus which comprises a waveguide for feeding micorwave through a microwave feeding window provided at an end thereof, a plasma cavity providing communication from another end of the waveguide thereto and having a discharging gas inlet, a specimen chamber providing communication from the plasma cavity thereto and having a specimen gas inlet, a magnetic field applying means placed in the vicinity of the plasma cavity and a substrate setting rest placed in the specimen chamber, wherein the minimum size of the section of the waveguide in the vicinity of the microwave feeding window is smaller than the mean free path of an electron and is smaller than a diameter of gyration (that is, a double length of the Larmor radius) of an electron in a magnetic field.

Thereby, the plasma discharge does not occur in the vicinity of the microwave feeding window. Further, in such an apparatus, the deposition of a thin film on the substrate located in the specimen chamber can be effectively performed because perdominant discharge occurs in the plasma cavity.

BRIEF DESCRIPTION OF THE DRAWINGS

Other features, objects and advantages of the present invention will become apparent from the following descriptions of preferred embodiments with reference to the drawings in which like reference characters designate like or corresponding parts throughout several views, and in which.

DETAILED DESCRIPTION OF PREFERRED EMBODIMENTS

Hereinafter, preferred embodiments of the present invention will be descirbed with reference to the accompanying drawings.

Figure 2:
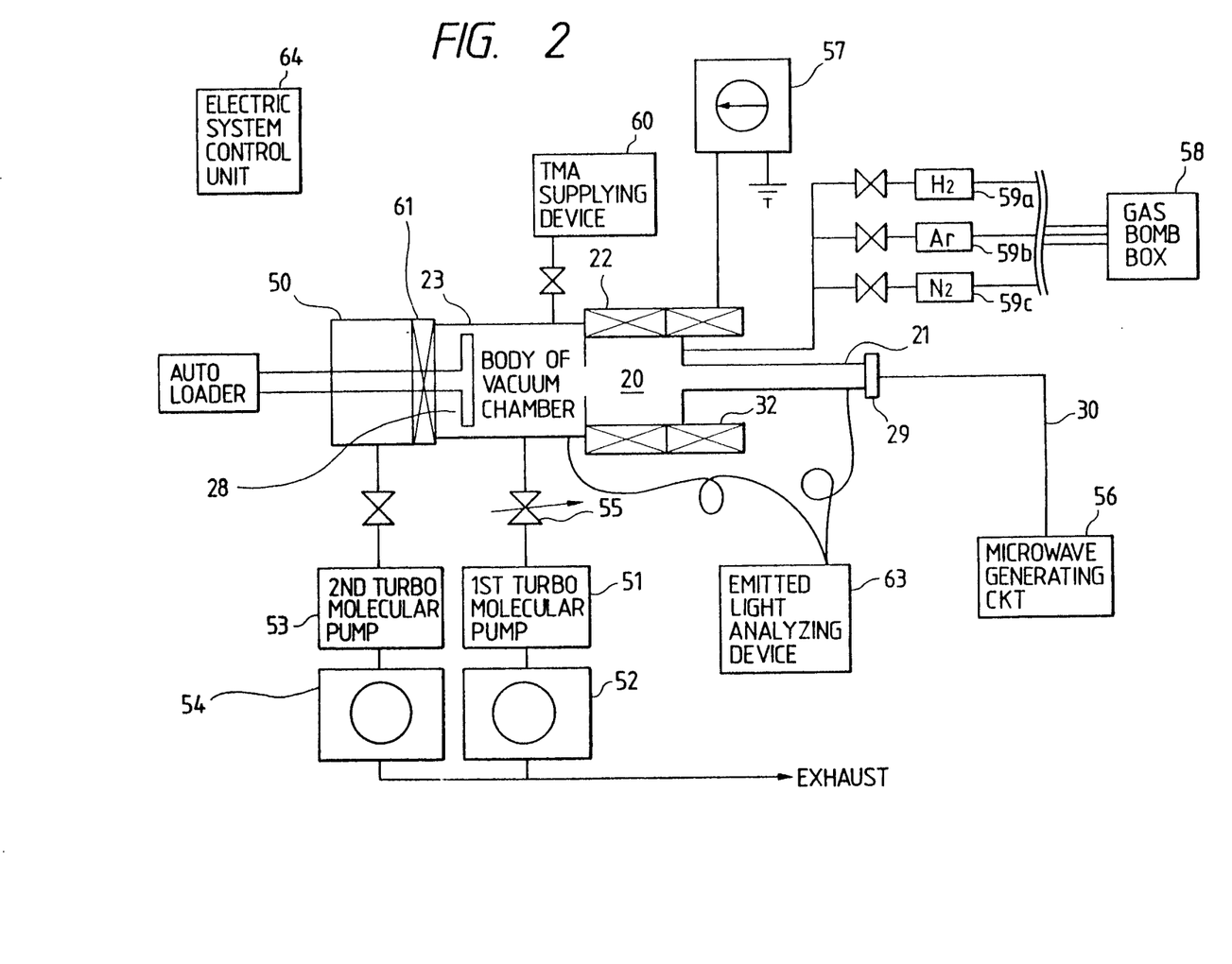
FIG. 2 is a block schematic diagram for showing the construction of a microwave plasma CVD system which is provided in common by each of first thru fourth preferred embodiments of the present invention.

Referring first to FIG. 2, there is shown the construction of a microwave plasma CVD system which is employed by each of a first, second, third and fourth embodiments in common.

As a shown in this figure, a body 20 of a vacuum chamber comprises a first waveguide 21, a plasma cavity 22, a specimen chamber 23 and a load-lock chamber 50. Further, the specimen chamber 23 and the load-lock chamber 50 are arranged such that air and other gases contained therein can be pumped out therefrom by using pumps. Namely, the air and other gases contained in the specimen chamber 23 can be exhausted by a first turbo molecular pump 51 and a first rotary pump 52. Similarly, the air and other gases contained in the load-lock chamber 50 can be exhausted by a second turbo molecular pump 53 a second rotary pump 54. The pressure in the specimen chamber is controlled by a butterfly valve 55.

Further, an end of the first waveguide 21 located at the side thereof opposite to the plasma cavity 22 is closed by the microwave feeding window 29 so that the atmosphere of air intercepted from the body 20 of the vacuum chamber. Additionally, the second waveguide 30 is connected to the outer surface of the microwave feeding window 29 at an end thereof. Furthermore, a microwave generating circuit 56 is provided at the other end of the second waveguide 30.

Further, a magnetic coil 32 is provided around the plasma cavity 22 and is connected to an independent current source 57 for supplying electric current thereto. Additionally, a $H_2$ gas distributing pipe line, an Ar gas distributing pipe line and a $N_2$ gas distributing pipe line extending from a gas bomb box 58 are connected to the plasma cavity 22 through mass flow controllers 59a, and 59c, respectively. The gaseous TMA is supplied from a TMA supplying device 60 to the specimen chamber 23.

Morevover, a gate valve 61 is provided between the specimen chamber 23 and the load-lock chamber 50 and is used to comstantly keep the background pressure in the specimen chamber 23 stable.

Additionally, by an auto-loader 62 provided outside the load-lock chamber 50, specimens can be exchanged and the position of a substrate setting rest 28 can be changed.

Furthermore, this microwave plasma CVD system or apparatus is provided with an emitted light analyzing device 63 for measuring the intensity of the plasma. Moreover, the electric system of this microwave plasma CVD apparatus is controlled by the electric system control unit 64.

Hereafter, a first embodiment will be described by referring to FIGS. 3 to 8.

Figure 3:
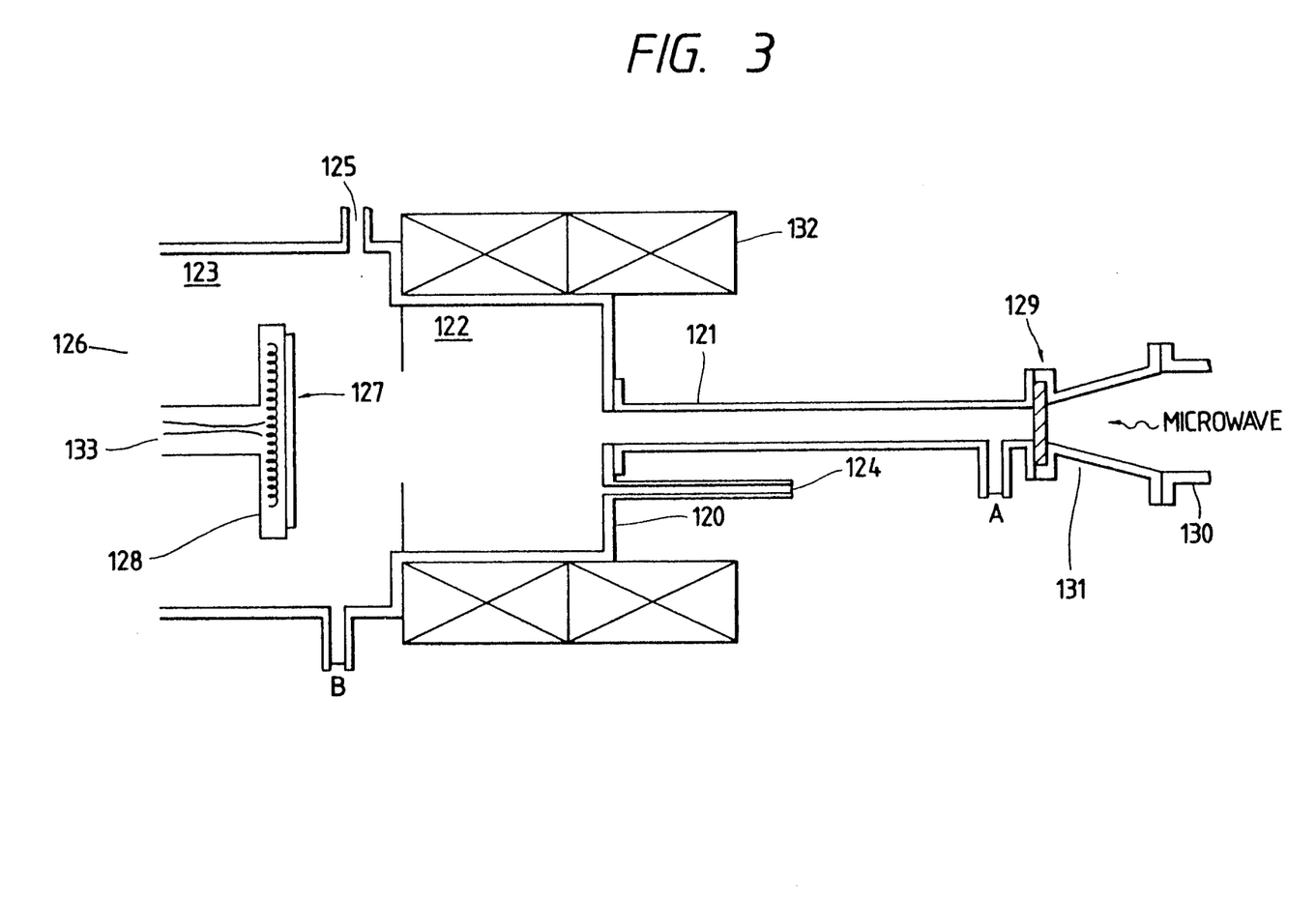
FIG. 3 is a sectional view of the microwave plasma CVD system provided in the first embodiment of the present invention.

Referring now to FIG 3, there is shown a sectional view of a microwave plasma CVD system provided in the first embodiment of the present invention. Further, this figure shows the construction of the system mainly the body of the vacuum chamber in detail. In this embodiment, a rectangular waveguide is used as a first waveguide 121.

First, it will be described hereinbelow how the microwave plasma CVD system according to the present invention is constructed and operates.

Microwave of frequency 2.45 GHz generated in the microwave generation circuit 56 shown in FIG. 2 is transmitted through a second waveguide or rectangular waveguide 130, a mode converter 131 for converting a guided mode and quaretz microwave feeding window 129 to a first waveguide 121.

Then, magnetic field is generated in a plasma cavity 122 by applying electric current to a magnetic coil 132 provided thereabout. Thus, the magnitude of the generated magnetic field is about 375 G at the boundary between the first waveguide 121 and the plasma cavity 122. As this magnitude of the magnetic field satisfies the ECR condition, ECR plasma discharge occurs. A substrate setting rest 128 for setting a substrate thereon and an evacuation outlet 126 are provided in a specimen chamber 123.

At the time of the depostion of a metal thin film on the substrate, H$_2$ gas is first fed from the first gas feeding window 124 placed in the plasma cavity 122 and simultaneously with this, TMA gas, which is preliminarily heated at 50° C. in a TMA supplying device 60 (shown in FIG. 2) including a TMA cylinder and sent to a second gas from a second gas feeding inlet 125 placed in the specimen chamber 123 thereinto.

The thus supplied H$_2$ gas is then efficiently dissociated or ionized by the action of the microwave in the plasma cavity 122 and further hydrogen radical or ion is extracted to the specimen chamber 123.

The extracted hydrogen radical or ion reacts with the TMA in the specimen chamber 123. Thus, the bonds Al-C and C-H of the TMA are dissociated by hydrogen, extraction reaction and as a consequence an Al-film is uniformly formed on the substrate 127. The substrate rest 128 can be heated by a heater 133 and thus the temperature of the rest 128 can be changed from room temperature to 500° C., as necessary.

Figure 4:
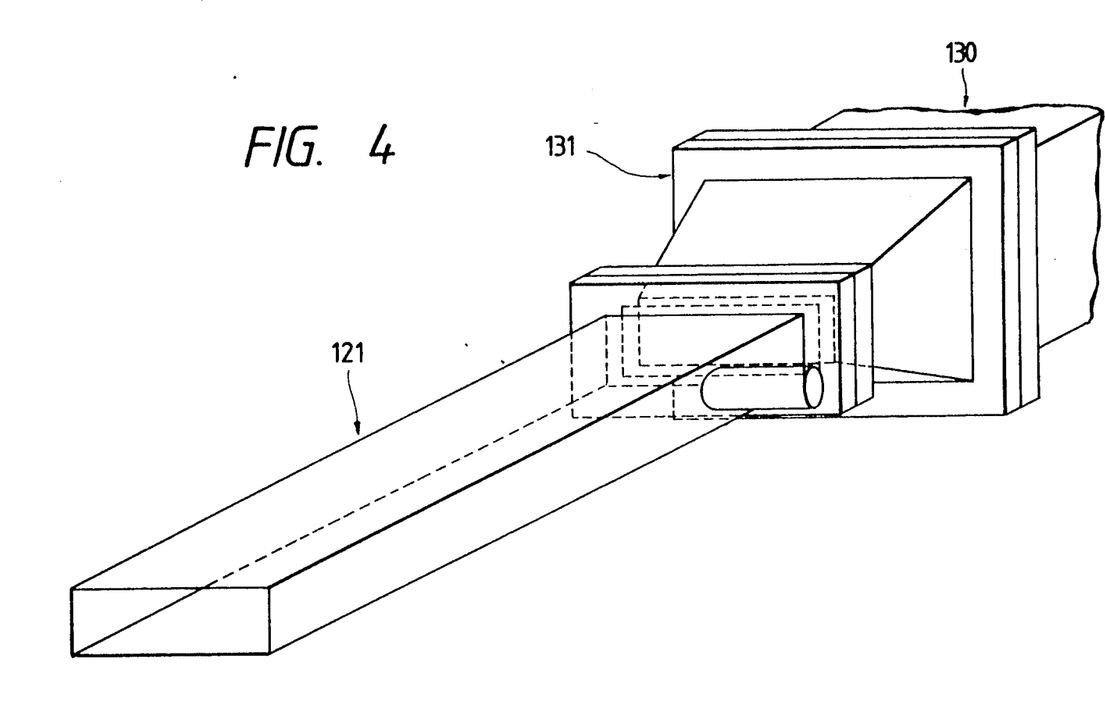
FIG. 4 is a perspective diagram for showing a rectangular waveguide.

Turning now to FIG. 4, there is shown a detail perspective view of the first waveguide 121. As shown in this figure, the first waveguide 121 is a rectangular waveguide of which the length in the direction of propagating the microwave (that is, the longitudinal direction) is 570 mm and of which the section has a height of 27 mm and a width of 96 mm. In the thus constructed first waveguide 121, only the microwave of a fundamental mode, that is, TE$_{10}$ wave can propogate.

Here, the experiments of the deposition of a metal thin film made by practically using the thus constructed microwave plasma CVD system will be described hereinbelow. Incidentally, the results of the experiments indicate the fact that there are no deposits on the microwave feeding window 129.

The conditions of the experiments are as follows: The quantity of the TMA gas flow is 10 SCCM and that of the H$_2$ gas flow is 100 SCCM. At that time, the power of the microwave is 300 W and the pressure of the gas is maintained at one of two typical values, that is, 3 mTorr and 30 mTorr.

In the case where the pressure is 3 mTorr, the plasma discharge occurs dominantly in the plasma cavity 122. In contrast, in case where the pressure is 30 mTorr, the plasma discharge dominantly occurs in the first waveguide 121 and does not occur in the plasma cavity 122 where the plasma discharge is to inherently occur.

In order to measure the quantity of the deposit, a Si wafer is placed in the first waveguide 121 and further another 6 inch diameter Si wafer is placed on the substrate setting rest 128 in the specimen chamber 123. This substrate setting rest 128 is heated to 250° C. and is placed at a position which is 150 mm away from the boundary between the plasma cavity 122 and the specimen chamber 123 toward the chamber 123. Thereafter, the deposition of an Al film is effected by discharging for 60 minutes.

Figure 5:
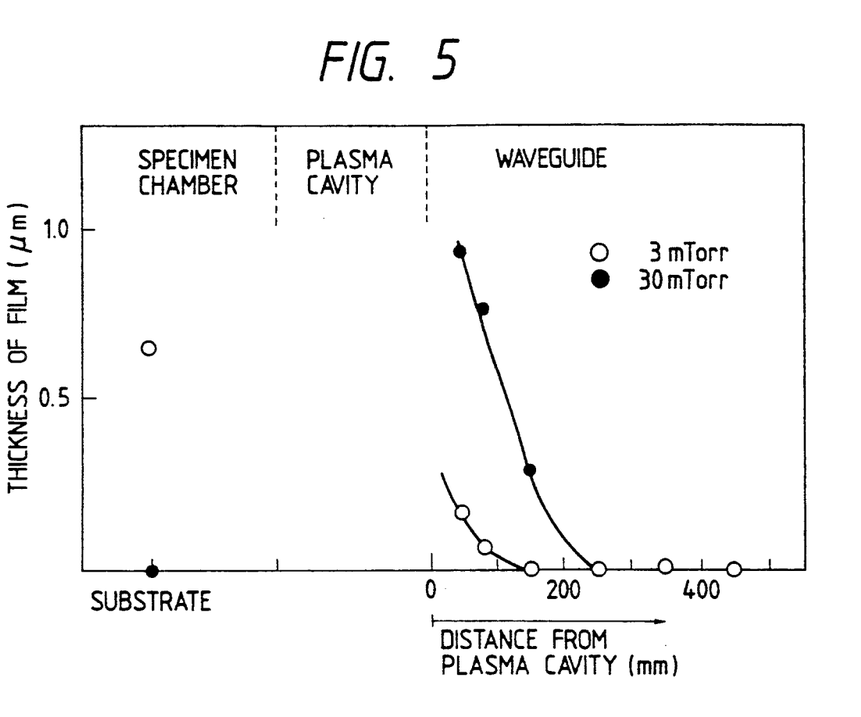
FIG. 5 is a graph illustrating the relation between the thickness of the deposited thin film and the positions in the apparatus.

FIG. 5 shows the results of this experiment, that is, the relation between the thickness of the film deposited on the Si substrate and the position or distance from the boundary between the plasma cavity 122 and the first waveguide 121. As shown in this figure, in case where the pressure of the gas is 30 mTorr (as indicated by black circles ●), there is no deposite on the substrate 12 and on the other hand an Al film is deposited on the position, which is 0 or 30 cm away from the boundary between the plasma cavity 122 and the first waveguide 121, on the inside surface of the first waveguide 121.

In contrast, in case where the pressure is 3 mTorr (as indicated by white circles ○), the deposition is dominantly effected on the substrate 12 and on the other hand the quantity of the deposit on the inside surface of the first waveguide 121 is less than or equal to one-fifth of that of the deposit in case where the pressure is 30 mTorr.

In either case, there is no deposition of an Al film at the microwave feeding window 129 and the discharge continues for 60 minutes. Thus, the above described problem of the conventional microwave plasma deposition system, namely, that of the instability of the discharge due to the deposition of the metal thin film at the microwave feeding window is resolved.

This is because the mean free paths of the gases are shorter than the length of the first waveguide 121 in either case.

To elucidate this phenomenon, the relation of the mean free path of a gas and the length in the direction of propagating microwave of the first waveguide will be described hereinbelow.

First, it is noted that the molecular diameter of H$_2$ mainly used in this plasma CVD system of the present invention as the gas as well as the atomic diameter of an Al atom, which is considered as composing the deposit, is approximately 1.4 Å. Thus, the mean free path of the Al atom can be given by the following equation.

$$\lambda_{Al} = (\tfrac{1}{4}\sqrt{2})(KT/P\sigma)$$

where K indicates Boltzman's constant; T a gas temperature (assumed to be 300° C.); P a gas pressure; and σ a collision cross section.

In the case where the pressure is 3 mTorr, the thus calculated value of the mean free path of the Al atom is 30.9 mm and on the other hand in case where the pressure is 30 mTorr, the calculated value is 3.1 mm. Therefore, it turns out that in either case, the mean free path of the Al atom is sufficiently short in comparison with the length 570 mm of the rectangular waveguide.

Further, in case that the pressure is 3 mTorr, the discharge dominantly occurs in the plasma cavity 122 and the Al atoms separated from the TMA dissociated in the plasma cavity 122 are diffused in random directions. If the Al atom advances to the first waveguide 121, the Al atom may have one collision with another Al atom while the Al atom advances within about 30 mm in the longitudinal direction thereof and consequently may be scattered in the transversal direction thereof. Thus, as shown in FIG. 5, the deposition of the aluminum occurs only near the inlet of the first waveguide 121 at the side of the plasma cavity 122. This is because the dissociation of the TMA dominantly occurs in the plasma cavity 122.

In contrast with this, if the pressure is 30 mTorr, the discharge dominantly occurs in the first waveguide 121. Thus, the dissociation of the TMA is effected in the first waveguide 121 and further there is no aluminum deposited in the specimen chamber 123. Moreover, in the first waveguide 121, the dissociation of the TMA is dominantly effected so that the quantity of the deposit becomes greater than that of the deposit in the case where the pressure is 3 mTorr. At the pressure of 30 mTorr, the plasma discharge dominantly occurs even at the portions preceding the microwave feeding window 129. However, the TMA is entirely deposited and consumed in the first waveguide 121. Therefore, the distribution of the thickness of the thin film becomes as indicated by white circles ◯ in FIG. 5.

Further, the following experiment is made for investigating the range of the degree of vacuum, that is, the pressure of gases in the vacuum chamber at which the discharge does not occur at the microwave feeding window and of a film is efficiently deposited.

That is, the discharging characteristics of the micro plasma CVD system as studied to find out the range of the pressure at which the discharge does not occur in the first waveguide 121 but dominantly occurs in the plasma cavity 122.

First, $H_2$ gas of 100 SCCM is supplied from a first gas feeding inlet 124 and then the pressure of the gas in the vacuum chamber 120 is changed from 1 to 50 Torr by using the butterfly valve 55 (shown in FIG. 2) provided at a gas exhausting outlet. In the meantime, the electric power of the microwave remains at a constant value of 300 W.

Figure 6:
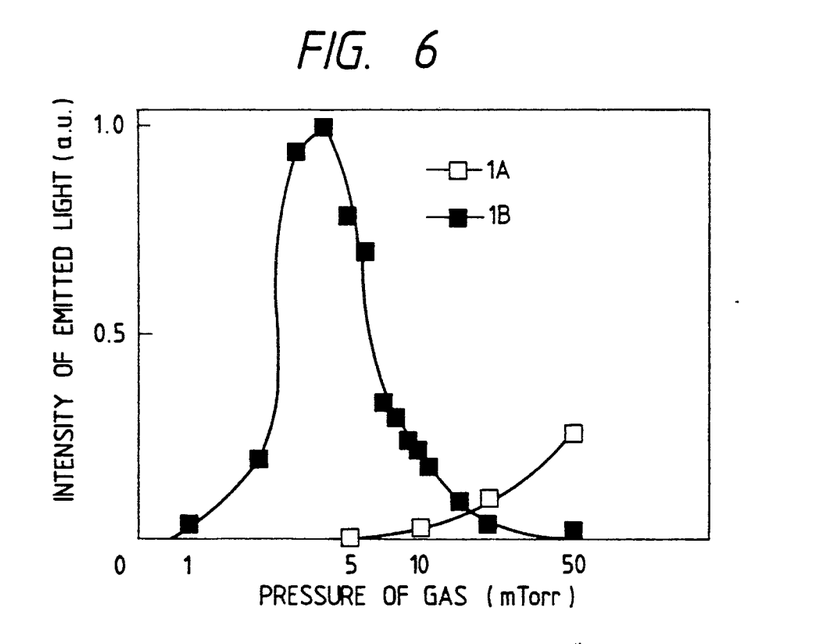
FIG. 6 is a graph showing the relation between the pressure of a gas and the intensity of light (corresponding to a H α line) emitted from hydrogen atoms.

FIG. 6 shows the relation between the pressure of the gas and the intensity of light corresponding to the $H\alpha$ line (the wavelength of which is 6563 Å) emitted from hydrogen atoms. In this figure, a crure IA indicates the intensity of the emitted light measured in the vicinity of the microwave feeding window 129 and monitored from the quartz window A shown in FIG. 3. Further, the measured data of the intensity of the emitted light are indicated by white squares □ in this figure. Moreover, another curve IB indicates the intensity of the emitted light measured at the boudary between the plasma cavity 122 and the specimen chamber 123 and monitored from the quartz window B shown in FIG. 3. Further, the measured data of the intensity of the emitted light are indicated by black squares ■ in this figure.

To measure the intensity of the emitted light, an emitted light analyzing device 63 using a diffraction grating and a photomultiplier is used.

As can be seen from FIG. 6, the intensity of the light indicated by the curve IB is at a maximum at about 4 mTorr and on the other hand, as the pressure increases, that of the light indicated by the curve IA becomes greater.

As a result of this experiment, it turns out that if the discharge is caused in this microwave plasma CVD system at a low pressure of approximately 1 thru 10 mTorr, the discharge does not occur at all in the neighborhood of the microwave feeding window 129 and further can dominantly occur in the plasma cavity 122.

Moreover, if the presssure is higher than 10 mTorr, the discharge does not occur in the plasma cavity 122 and on the other hand, the plasma is caused in the neighborhood of the microwave feeding window 129 and additionally no effective deposition occurs in the specimen chamber 123, differently from the above described experiment of the deposition.

Next, for the generation of optimum conditions or requirements of forming a film, the range of the pressure and the size of the waveguide are theoretically determined.

In theory, according to Paschen's law, whether or not the discharge is caused in a discharge tube depends on the relationship between the minimum size (in the direction of the electric field) of the transversal section of the waveguide and the mean free path of an electron.

Figure 7A:
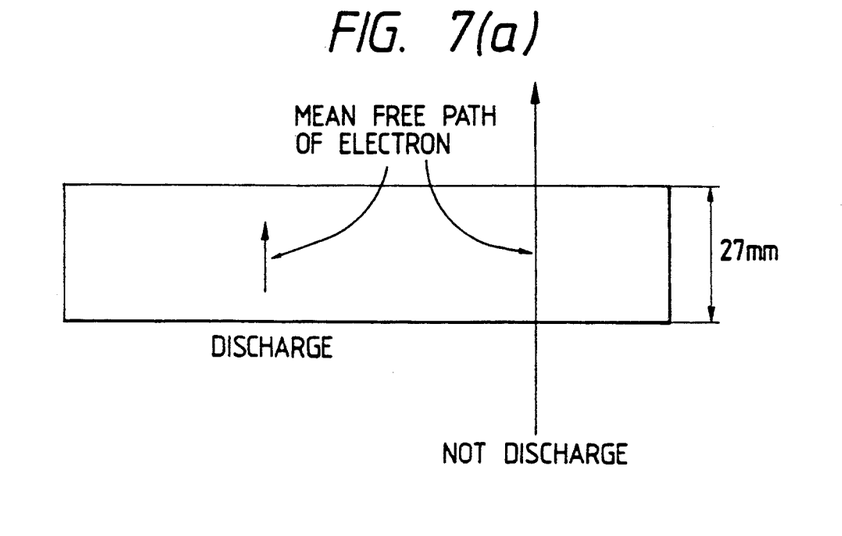
FIG. 7 is a sectional view of the rectangular waveguide for illustrating the relation between the section of the waveguide and the movement of an electron.

Further, FIG. 7(a) shows a sectional view of a rectangular waveguide for illustrating a discharge phenomenon. In the case where the discharge continues, the minimum size (27 mm) of the section of the waveguide is larger than the mean free path of the electron represented by the magnitude of a vector shown at the left side of this figure. Further, in the case where the discharge does not continue, the minimum size (27 mm) of the section of the waveguide is smaller than the mean free path of the electron represented by the magnitude of another vector shown at the right side thereof. In the latter case, if the electron has a collision with an atom of the gas, it collides against the inside wall of the waveguide before having the next colision with one of the atoms of the gas. Thus, the discharge does not occur. It is judged from the following calculation whether or not the discharge occurs in the waveguide.

In the case of the rectangular waveguide of the first embodiment, the pressure of the gas at which the length $\lambda e$ of the mean free path of the electron is equal to the above described minimum size 27 mm of the section of the waveguide is obtained by the following equation.

$$\lambda e = KT/P\sigma$$

where K indicates the Boltzam's constant; T is a gas temperature (assumed to be 300° C.); P is the gas pressure; and $\sigma$ is the collision cross section.

As a result, such a value of the pressure P is obtained as follows:

$$P = 12.5 \text{ mTorr.}$$

This accounts for the resultant distribution of the intensity $H\alpha$ of the emitted light represented by the curve IB shown in FIG. 6.

That is, it is a necessary condition for continuing the discharge that the minimum size of the section of the waveguide is larger than the mean free path of the electron.

Figure 7B:
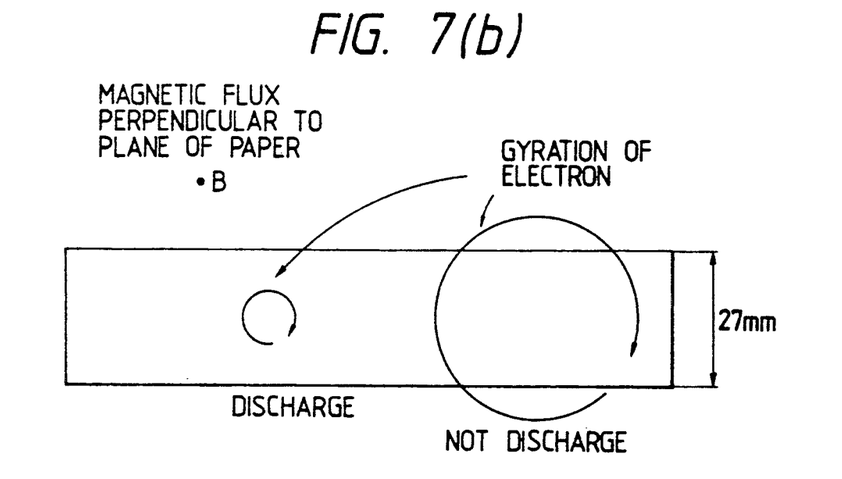

Further, when the direction of the magnetic field is perpendicular to the plane of the paper, an electron rotates around the magnetic flux as shown in FIG. 7(b). Thus, in case where the diameter of gyration of an electron is smaller than the minimum size of the section of the waveguide in the presence of the magnetic field as shown at the left side of this figure, the discharge may occur even if the minimum of the section of the waveguide is smaller than the mean free path of the electron.

To analyze this, the following measurement and calculation are effected.

Figure 8:
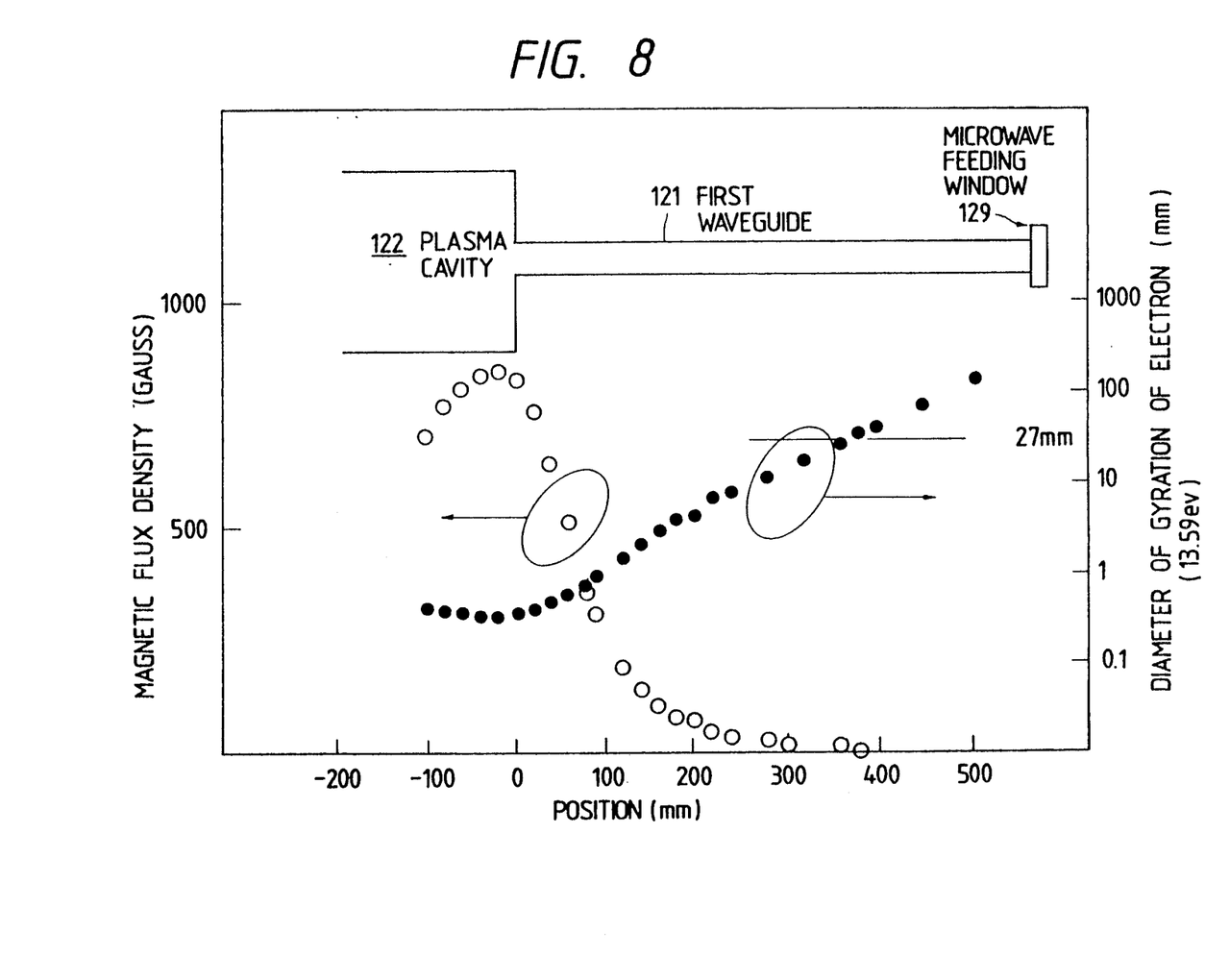
FIG. 8 is a graph showing the relation between magnetic flux density and the position in the apparatus as well as the relation between a diameter of gyration of an electron and the positions in the apparatus.

Namely, the distribution of the magnetic field strength in the first waveguide 121 and the plasma cavity 122 is measured by a magnetic-field measuring device. In FIG. 8, the horizontal axis represents the position or distance from a reference position, that is, the boundary between the plasma cavity 122 and the waveguide 121 and the vertical axis represents the magnetic flux density, the values of which are plotted by white circles ◯. Further, abscissas representing the distances from the reference position in the direction toward the plasma feeding window 129 have a positive value. The magnetic flux density reaches a maximum at a position-30 mm, and that is in the inside of the plasma cavity 122 and becomes smaller as the position is changed toward the microwave feeding window 129. In the center of the first waveguide 121, the magnetic flux density is about 20 Gausses (G). Further, in the neighborhood of the microwave feeding window 129, the magnetic flux density is equal to or less than 0.1 G.

As to the mechanisms of the discharge in the case wherein hydrogen atoms dominate, it is necessary to effect at least the process of the ionization of the hydrogen. Further, to continue the discharge, either H+ (of which the ionization potential is 13.59 eV) or H$_2^+$ (of which the ionization potential is 15.42 eV) should be continuously obtained by the ionization of the hydrogen. That is, the energy of the electron required to continue the discharge is at least 13.59 eV. Thus, the diameter De of the gyration of an electron is calculated by the following equation.

$$De = \underline{Re} \times 2 = 2 \times (\underline{m}/\underline{e}B) \times \sqrt{(2\underline{e}T)/m}$$

where Re indicates the radius of the gyration of the electron in the magnetic field which is known as the Larmor radius; $\underline{m}$ is the mass of an electron; $\underline{e}$ is an elementary electric charge; B the magnetic flux density or the strength of the magnetic field; and T is the temperature of the electron or the energy sufficient to ionize a gas.

Moreover, in FIG. 8, the diameter De of the gyration of the electron having the energy of 13.59 eV thus calculated by using the value of the magnetic field strength the white circles is shown by plotted by black circles ●. As the electron gets nearer to the microwave feeding window 129, the diameter De of the gyration of the electron becomes larger. In comparison with the longitudinal length of 27 mm, the diameter De of the gryration of the electron exceeds 27 mm if the value of the position of the electron represented by the abscissa is equal to or larger than 100 mm.

In the range of the position from 400 mm (corresponding to the first waveguide 121) to that of the microwave feeding window 129, the diameter De of the gyration of an electron having the energy sufficient to ionize a hydrogen atom is larger than 27 mm. Such electrons have no collisions with the hydrogen atoms and directly collide against the inside wall of the waveguide. Therefore, it is difficult to discharge. Namely, it is necessary for preventing the occurrence of the discharge that the magnetic flux having the magnetic flux density B (TESLA) which satisfies the following condition when the length of the shorter one of a vertical or horizontal side of the rectangular waveguide is taken to be 2r, it is required that 2re > 2r, and, since 2re = 2×(-m/eB)×√2eT/m as stated above, this equation may be substituted into the equation of 2re > 2r) is present in the discharge tube, especially, in the vicinity of the microwave feeding window:

$$B < (1/r)\sqrt{(2mT)/e}$$

where T designates the lowest temperature of the electron having the energy sufficient to ionize the gas.

In summary, the discharge cannot occur at all near the microwave feeding window if the following two conditions are simultaneously satisfied:

① The means free path of the electron is longer than the minimum size of the section of the waveguide.
② In the neighborhood of the microwave feeding window, the following equation holds:

$$B < (1/r)\sqrt{(2mT)/e}.$$

Moreover, these conditions ① and ② are most preferable conditions of the deposition of a metal thin film for causing the plasma discharge dominantly in the plasma cavity.

Next, a second embodiment of the present invention will be described hereinafter.

Figure 9:
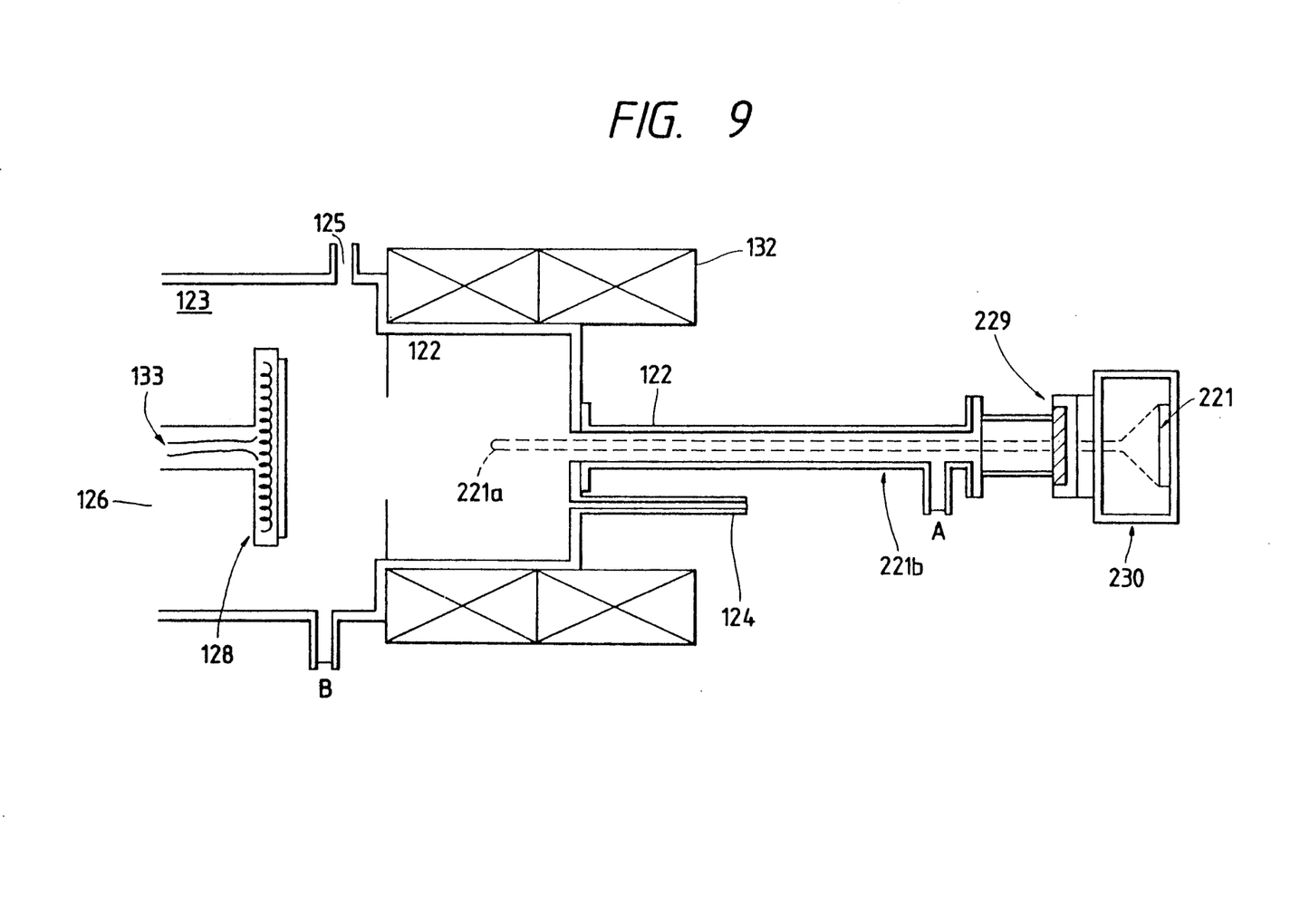
FIG. 9 is a sectional view of the microwave plasma CVD system provided in the second embodiment of the present invention.

FIG. 9 shows the construction of the microwave plasma CVD system employed in the second embodiment of the present invention. In this figure, same reference numbers designate parts corresponding to parts shown in FIG. 3 and having the same functions as those of the corresponding parts shown in FIG. 3. The second embodiment of the present invention is characterized in that a coaxial waveguide is used as a first waveguide.

Hereinafter, the construction as well as the operation of the second embodiment will be described. First, the microwave generated by the microwave generating circuit 50 is propagated through a rectangular waveguide 230 (that is, a second waveguide), converted by the mode converting device 231 into the wave of the fundamental mode of the coaxial waveguide and connected to a coaxial waveguide 221 by way of a microwave feeding window 229 made of alumina ceramics or beryllia and provided between the rectangular waveguide (the second waveguide) 230 and another coaxial waveguide (a first waveguide) 221. This microwave feeding window 229 is used for the vacuum sealing of the space between the rectangular waveguide 230 and the coaxial waveguide 221. The microwave propagated through the coaxial waveguide 221 is led to the plasma cavity 122 in which an end of an inner conductor 221a of the coaxial waveguide 221 linearly extends and serves as a microwave antenna.

By transferring the microwave by use of this antenna, this embodiment prevents the decrease in efficiency in generating the plasma due to the fact that when plasma of high density is generated in the plasma cavity 122, the propagated microwave is reflected by the generated plasma. Thereby, large power can be supplied to the plasma cavity 122.

Furthermore, a magnetic coil is arranged to surround the periphery of the plasma cavity 122 in such a manner that a magnetic field having the strength of 875 G is generated in the plasma cavity 122.

The structure and the size of the characterizing portion of this embodiment, that is, the coaxial waveguide, will hereafter be described. The coaxial waveguide is shown in FIG. 9 in detail.

Figure 10:
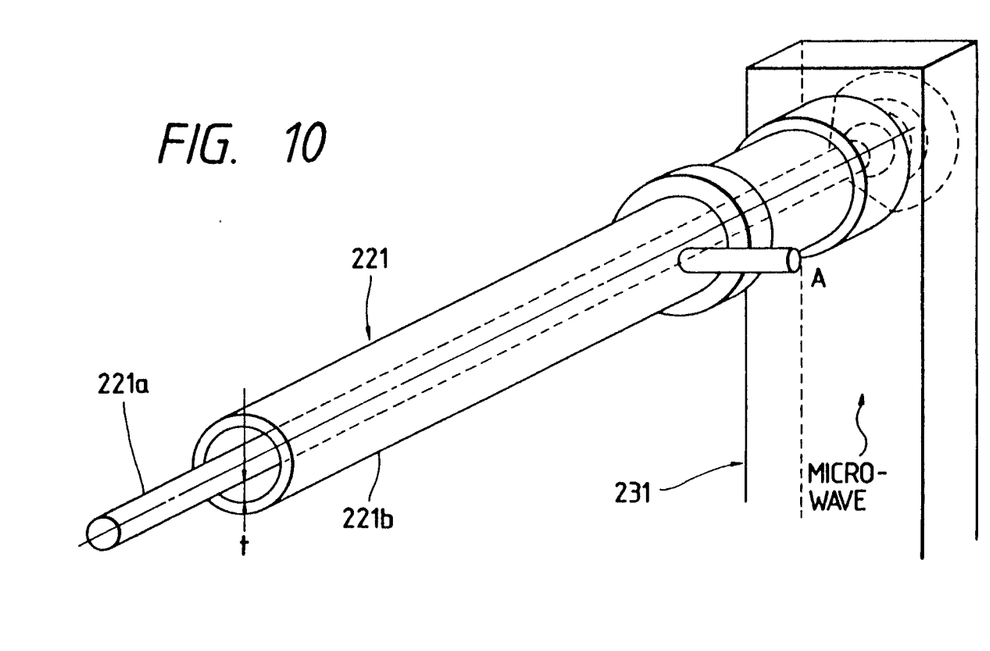
FIG. 10 is a perspective diagram of a coaxial waveguide.

Further, the impedance of the rectangular waveguide marketed for commercial use, of which the fundamental mode is T$_{10}$ wave, is set as 50 Ω. Moreover, it is necessary for effecting the impedance matching of the coaxial waveguide to set the impedance Z$_o$ of the coaxial waveguide as 50 Ω. The impedance Z$_0$ is obtained by $$Z_o = \sqrt{(\mu/\epsilon)} \ln(\underline{b}/\underline{a})/2\pi$$

where μ represents the permeability of the coaxial waveguide; ε is the dielectric constant thereof; a is the radius of the inner conductor 221a; and b is the inside radius of the external conductor. By calculating backward, it is necessary that the value of an expression (b/a) is 2.3. In this embodiment, the values of a and b are designed to be 7.7 mm and 1.76 mm, respectively, in order to make the value of the difference (b−a), which is indicated by "t" in FIG. 10, between them sufficiently small. Additionally, the length of the coaxial waveguide is designed to be 570 mm.

Furthermore, this embodiment is characterized in that the value 9.9 mm of the difference (b−a) is smaller than the minimum size 27 mm of the section of the waveguide in this embodiment. Similar experiments effected in this embodiment under the same conditions as in case of the first embodiment reveal that this embodiment gains the following advantages over the first embodiment:

ⓐ Even if the degree of vaccum has the same value with that of the first embodiment, the region in which the discharge is effected is further smaller than that in the case of the first embodiment.

ⓑ The quantity of the deposit in the waveguide is less than in the case of the first embodiment.

ⓒ In contrast with the first embodiment, large power can be supplied to the plasma cavity because the inner conductor of the coaxial waveguide acts as an antenna.

ⓓ By using the coaxial line, the frequency bandwidth of the microwave used in the second embodiment can be made larger than in the case of the first embodiment.

Incidentally, a helical inner conductor can be used in the second embodiment in spite of the inner conductor as shown in FIG. 10. Thereby, it can prevent the microwave from being reflected into the plasma cavity 122 and further the energy can be supplied thereto at high efficiency. Moreover, in the plasma cavity 122, the plasma can be uniformly generated in relatively larger area by, for example, using a "Lisitano coil" (as disclosed in an article by G. Lisitano et al. printed in The Rev. of Sci. Instrument Vol. 39, No. 3, 1968) as an antenna.

Figure 11:
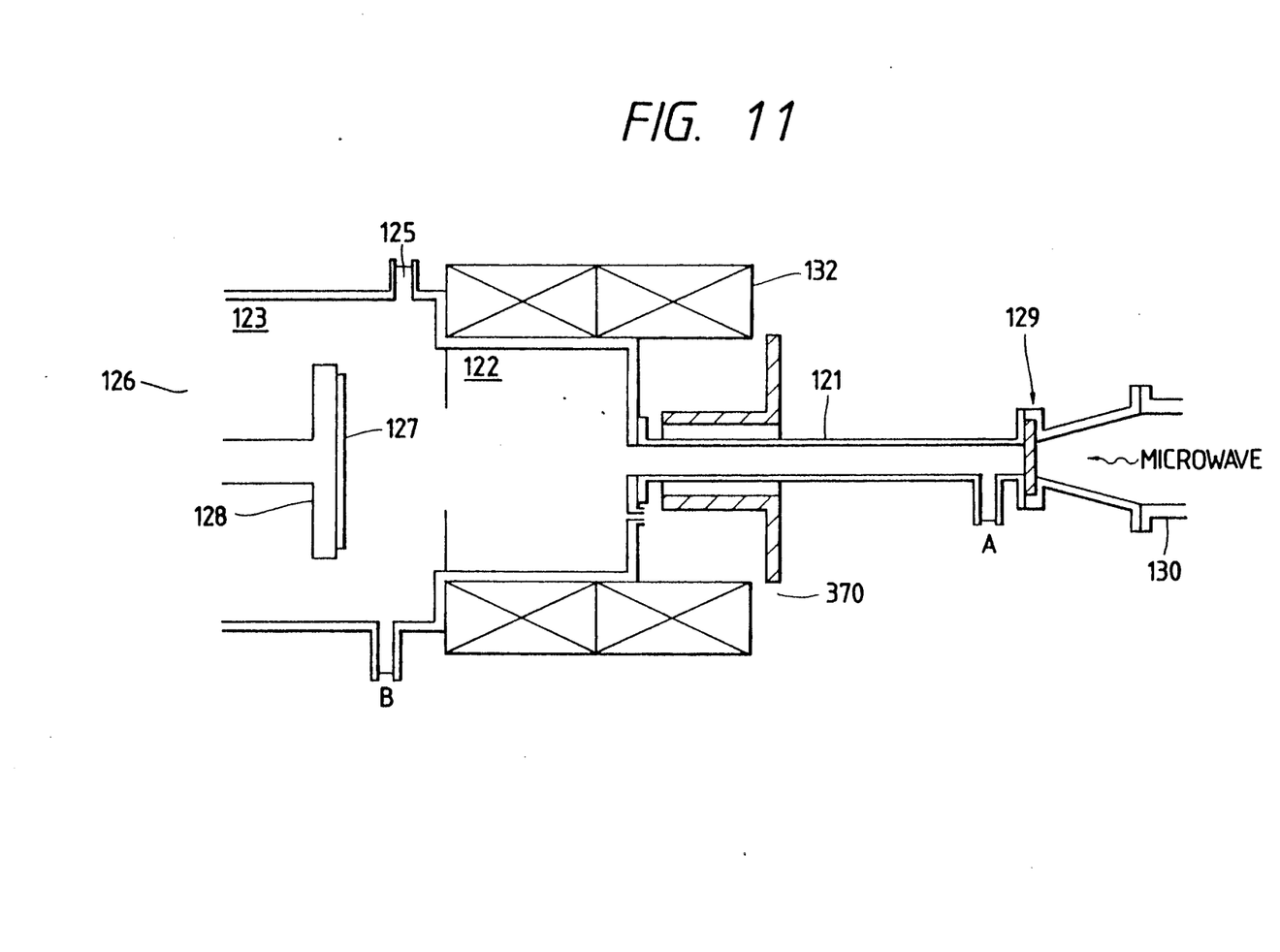
FIG. 11 is a sectional view of the microwave plasma CVD system provided in the third embodiment of the present invention.

Next, a third embodiment of the present invention will be described by referring to FIG. 11 in which same reference numbers designate same parts as corresponding parts shown in FIG. 3 and having the same functions as those of the corresponding parts shown in FIG. 3. As can be easily seen from FIG. 11, the basic structure of the third embodiment is the same with that of the first embodiment.

The third embodiment is characterized in that in order to decrease the magnetic field strength in the first waveguide, a shielding plate 370 made of ferromagnetic material is provided around a first waveguide 121. Thereby, the magnetic field strength of the first waveguide 121 lowers in the neighborhood of the plasma cavity 122. In case where the degree of vacuum is low (for instance, 5 mTorr), the discharge does not occur in the waveguide at all.

Further, the shielding plate 370 made of ferromagnetic material can be used in the coaxial waveguide of the second embodiment to derive the similar effects from the second embodiment as above described.

Furthermore, it is noted that the waveguide itself can be made of ferromagnetic material.

Figure 12:
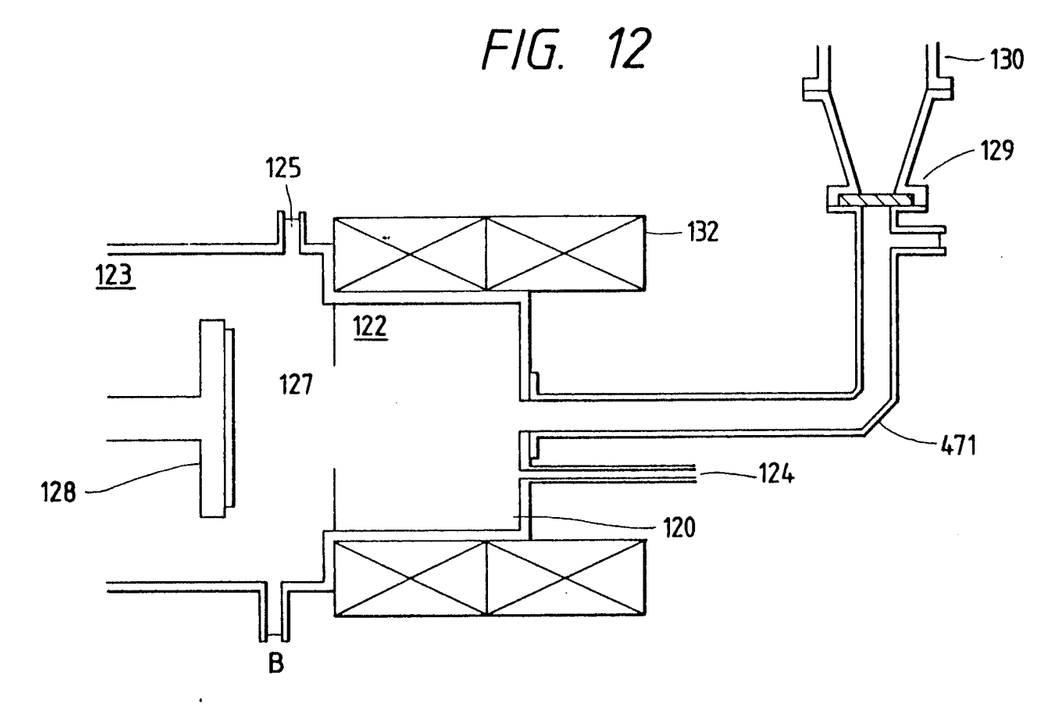
FIG. 12 is a sectional view of the microwave plasma CVD system provided in the fourth embodiment of the present invention.

Turning now to FIG. 12, still another micro plasma film deposition system, that is, a fourth embodiment of the present invention will be described hereinbelow. In this figure, same reference numbers indicate same portions as corresponding portions shown in FIG. 3 and having the same functions as those of the corresponding portions shown in FIG. 3. As can be seen from FIG. 12, the structure of the third embodiment is the same as that of the first embodiment excepting that the first waveguide 121 of the fourth embodiment is provided with a bend 471.

In this embodiment, the distance from the plasma cavity 122 to the bend 471 is arranged to be 200 m. In this case, even if Al atoms are diffused in the space between the plasma cavity 122 and the bend 471 of the first waveguide 121, the Al atoms collide against the inner wall of the bend 471 of the first waveguide 121 and are deposited on the inner wall and consequently do not reach the microwave feeding window. Further, by regulating the distance from the plasma cavity 122 to the bend 471 as longer than the mean free path of the gas, the same effects can be derived from the fourth embodiment.

Incidentally, it is apparent to those skilled in the art that the advantage of the present invention can be taken if a sputtering target is used as a metal source in the microwave plasma CVD systems of the above described first thru fourth embodiments and that the deposition of a thin film can be effected by using any other metal thin film or conductive thin film only if a compound gas is supplied or a target is provided in the system.

While preferred embodiments of the present invention have been described above, it is to be understood that the present invention is not limited thereto and other modifications will be apparent to those skilled in the art without departing from the spirit of the invention. The scope of the present invention, therefore, is to be determined solely by the appended claims.

What is claimed is:

1. A microwave plasma film deposition system, comprising:
   a rectangular waveguide for feeding microwaves by way of a microwave feeding window provided at an end thereof, the size of a shorter one of vertical and horizontal sides of a cross-section of said rectangular waveguide being equal to or shorter than the mean free path of an electron of a gas in said rectangular waveguide;
   a plasma cavity in communication with another end of said waveguide and further having a discharge gas inlet which is not in communication with said waveguide;
   a specimen chamber in communication with said plasma cavity and having a substrate setting rest therein and a material gas inlet; and
   magentic field applying means provided near said plasma cavity for generating plasma in said plasma cavity,
   wherein the strength B (TESLA) of the magnetic field near said microwave feeding window satisfies the following condition:

$$B < (1/r)\sqrt{(2mT)/e}$$

where 2r is the size of a shorter one of vertical and horizontal sides of a cross-section of said rectangular waveguide; m (kg) is the mass of the electron; e (C) is the electric charge of the electron; and T (eV) is the energy sufficient to ionize the gas.

2. A microwave plasma film deposition system as set forth in claim 1, wherein ferromagnetic material is provided around said rectangular waveguide to lower the strength of a magnetic field in said rectangular waveguide.

* * * * *